(12) United States Patent
Ahmed

(10) Patent No.: US 9,093,264 B2
(45) Date of Patent: Jul. 28, 2015

(54) METHODS AND APPARATUS FOR FORMING SILICON PASSIVATION LAYERS ON GERMANIUM OR III-V SEMICONDUCTOR DEVICES

(71) Applicant: Applied Materials, Inc., Santa Clara, CA (US)

(72) Inventor: Khaled Z. Ahmed, Anaheim, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/865,756

(22) Filed: Apr. 18, 2013

(65) Prior Publication Data

US 2013/0280918 A1    Oct. 24, 2013

Related U.S. Application Data

(60) Provisional application No. 61/635,941, filed on Apr. 20, 2012.

(51) Int. Cl.
*H01L 21/205* (2006.01)
*H01L 21/02* (2006.01)
*H01L 21/28* (2006.01)
*H01L 29/51* (2006.01)

(52) U.S. Cl.
CPC ...... *H01L 21/02123* (2013.01); *H01L 21/0237* (2013.01); *H01L 21/0262* (2013.01); *H01L 21/02532* (2013.01); *H01L 21/28255* (2013.01); *H01L 21/28264* (2013.01); *H01L 29/517* (2013.01)

(58) Field of Classification Search
CPC ............. H01L 21/02123; H01L 21/28255; H01L 21/02532; H01L 21/0262; H01L 21/02381
USPC ............. 438/584, 478, 761, 762, 765, 197
See application file for complete search history.

(56) References Cited

U.S. PATENT DOCUMENTS

| | | | |
|---|---|---|---|
| 5,036,374 A * | 7/1991 | Shimbo | 257/192 |
| 5,186,718 A | 2/1993 | Tepman et al. | |
| 8,778,811 B2 * | 7/2014 | Kraus et al. | 438/763 |
| 2004/0266211 A1 * | 12/2004 | Tao et al. | 438/758 |
| 2010/0270590 A1 * | 10/2010 | Ahn et al. | 257/190 |
| 2011/0124187 A1 * | 5/2011 | Afzali-Ardakani et al. | 438/565 |
| 2011/0316101 A1 * | 12/2011 | Dang et al. | 257/418 |

OTHER PUBLICATIONS

Mitard et al., "Record Ion/Ioff performance for 65 nm Ge pMOSFET and novel Si passivation schemem for improved EOT scalability" Electronic Devices Meeting, IEDM, IEEE International (2008): pp. 1-4.*
Leys et al., "Thin epitaxial Si films as a passivation method for Ge(100): Influence of deposition temperature on Ge surface segregation and high-k/Ge interface quality" Materials Science in Semiconductor Processing, vol. 9 (2006): pp. 679-684.*
Chapter 5.6 Atomic Layer Deposition, University of Washington, http://depts.washington.edu/solgel/documents/class_docs/MSE502/Ch_5_Section_%205.6-5.11.pdf (2005): pp. 1-18.*

(Continued)

*Primary Examiner* — Michele Fan
(74) *Attorney, Agent, or Firm* — Servilla Whitney LLC

(57) ABSTRACT

Described are apparatus and methods for forming silicon interfacial layers on germanium or III-V materials. Such silicon layers may be deposited by atomic layer deposition at specific temperatures to avoid interdiffusion of silicon and the germanium or III-V material.

9 Claims, 2 Drawing Sheets

(56) References Cited

OTHER PUBLICATIONS

Kitahara et al., "Reflection High-Energy Electron Diffraction of Heteroepitaxy in Chemical Vapor Deposition Reactor: Atomic-Layer Epitaxy of GaAs, AlAs and GaP on Si", Jpn. J. Appl. Phys., 32 (1993): pp. 1051-1055.*

ASM, "Epsilon Epitaxy", http://www.asm.com/en/pages/epsilonepitaxy.aspx (date unknown, but pages downloaded Aug. 2014).*

"Gas-phase-reaction-controlled atomic-layer-epitaxy of silicon", Journal of Vacuum Science Technology, A 16(2), Mar./Apr. 1998, pp. 679-684.

"Epitaxial Si films on Ge(100) grown via H/Cl exchange", Applied Physics Letters, 62 (5), Feb. 1, 1993, pp. 510-512.

"A Novel Atomic Layer Epitaxy Method of Silicon", Japanese Journal of Applied Physics, vol. 30 No. 12B, Dec. 1991, pp. 3646-3651.

"Interdiffusion of Si and Ge Atoms during Gas-Source MBE of Ge on Si(100) at 500-800 C" Japanese Journal of Applied Physics, vol. 29 No. 9, Sep. 1990, pp. L 1591-L 1593.

"Atomic layer epitaxy of Si on Ge(100) using $Si_2Cl_6$ and atomic hydrogen", Applied Physics Letters, 64 (7), Feb. 14, 1994, pp. 884-886.

"Atomic Layer-by-Layer Epitaxy of Silicon and Germanium Using Flash Heating in CVD", Colloque C5, supplement au Journal de Physique II, vol. 5, Jun. 1995, pp. C5-1101-C5-1108.

"Si passivation for Ge pMOSFETs: Impact of Si cap growth conditions", Solid-State Electronics, 2011, pp. 1-6.

"Self-limiting atomic-layer deposition of Si on $SiO_2$ by alternate supply of $Si_2H_6$ and $SiCl_4$" Applied Physics Letters, vol. 79, No. 5, Jul. 30, 2001, pp. 617-619.

"A Fast and Accurate Method to Study the Impact of Interface Traps on Germanium MOS Performance", IEEE Transactions on Electron Devices, 2011, pp. 1-7.

"Physical Origins of Mobility Enhancement of Ge pMISFETs with Si Passivation Layers", 2009 Symposium on VLSI Technology Digest of Technical Papers, pp. 80-81.

"Record $I_{ON}/I_{OFF}$ performance for 65nm Ge pMOSFET and novel Si passivation scheme for improved EOT scalability", IMEC pp. 1-4 (date 2008).

"Alternative surface passivation on germanium for metal-oxide-semiconductor applications with high-k gate dielectric", Applied Physics Letters, vol. 85, No. 18, Nov. 1, 2004, pp. 4127-4129.

"Atomic layer epitaxy of Si on Ge(1 00): Direct recoiling studies of film morphology", Journal of Applied Physics, vol. 76 (3), Aug. 1, 1994, pp. 1615-1621.

"Characteristics of Self-Aligned Gate-First Ge p- and n-Channel MOSFETs Using CVD HfO2 Gate Dielectric and Si Surface Passivation", IEEE Transactions on Electron Devices, vol. 54, No. 4, Apr. 2007, pp. 733-741.

* cited by examiner

METHODS AND APPARATUS FOR FORMING SILICON PASSIVATION LAYERS ON GERMANIUM OR III-V SEMICONDUCTOR DEVICES

CROSS-REFERENCE TO RELATED APPLICATIONS

This application claims the benefit under 35 U.S.C. §119 (e) to U.S. Provisional Application No. 61/635,941, filed Apr. 20, 2012, the entire content of which is incorporated herein by reference in its entirety.

FIELD

Embodiments of the present invention generally relate to the field of semiconductor manufacturing processes and devices, particularly to methods and apparatus for forming gate dielectric interfacial layers on Ge or III-V semiconductor devices.

BACKGROUND

Microelectronic devices are fabricated on a semiconductor substrate as integrated circuits in which various conductive layers are interconnected with one another to permit electronic signals to propagate within the device. An example of such a device is a complementary metal-oxide-semiconductor (CMOS) field effect transistor (FET) or MOSFET.

An exemplary FET or MOSFET includes a gate electrode on a gate dielectric layer on a surface of a silicon substrate. Recently Ge and III-V channel transistors have attracted great attention as new materials due to their high electron and hole mobility over silicon. One of the most crucial issues in establishing Ge and III-V CMOS technologies is to realize good Ge/insulator or III-V/insulator interfaces for both n- and p-MOSFETs. As with $SiO_2$/Si, very promising results for the effective surface hole mobility using $GeO_2$/Ge interface have been reported in p-MOSFETs. However, the use of $AsO_x$ or $GeO_2$ interfacial layers and deposited high-k dielectric materials has not provided high electron mobility n-MOSFETs, due to chemical and thermal instabilities of $AsO_x$ and $GeO_2$, as well as the high trap density near the conduction band of the Ge or III-V, which results in electron scattering and lower electron mobility.

Therefore, there is a need for new interfacial layers between Ge or III-V materials and high-k dielectrics, as well as methods and apparatus for forming such layers.

SUMMARY OF THE INVENTION

One aspect of the current invention relates to a method of processing a substrate to provide a silicon passivation layer. In embodiments of this aspect, a silicon layer is deposited on a substrate having a germanium or III-V semiconductor surface via an atomic layer deposition process, and then a dielectric layer is deposited on the silicon layer.

According to one or more embodiments, the silicon layer is deposited at a temperature to avoid interdiffusion of silicon with the germanium or III-V semiconductor surface. In some embodiments, the substrate temperature is maintained below 400° C. during the atomic layer deposition process. In further embodiments, the substrate temperature is maintained below 350° C. during the atomic layer deposition process The thickness of the silicon layer may be a predetermined thickness, such as less than 2 nm or less than 1 nm.

According to some embodiments, the dielectric layer is also deposited in an atomic layer deposition process. The dielectric layer may be a high-k dielectric. In one or more embodiments, the high-k dielectric layer comprises one or more of hafnium oxide, tantalum oxide and tantalum silicate.

The substrate may be processed prior to depositing the silicon layer. In some embodiments, the substrate surface is cleaned by atomic hydrogen cleaning prior to depositing the silicon layer.

In one or more embodiments, the substrate is not exposed to air between certain processing steps. Some embodiments provide that the substrate is not exposed to air between atomic hydrogen cleaning and depositing the silicon layer and/or the substrate is not exposed to air between depositing the silicon layer and depositing the dielectric layer.

Another aspect of the current invention relates to a method of cleaning a substrate and providing a silicon layer. In embodiments of this aspect, a substrate having a germanium or III-V semiconductor surface is cleaned by atomic hydrogen cleaning, a silicon layer is deposited on the surface of the substrate via an atomic layer deposition process, and a dielectric layer is deposited on the silicon layer.

The substrate temperature may be maintained below a certain temperature while depositing the silicon layer, such as below 400° C. or below 350° C.

In some embodiments, the silicon layer has a thickness less than 2 nm or less than 1 nm.

According to one or more embodiments, the substrate is not exposed to air between atomic hydrogen cleaning and depositing the silicon layer and/or the substrate is not exposed to air between depositing the silicon layer and depositing the dielectric layer.

Yet another aspect of the invention relates to a substrate processing apparatus for providing silicon layers. The apparatus may comprise a chamber body, one or more injectors, and a control system. The control system may comprise a silicon precursor flow controller that controls the quantity of silicon precursor delivered by the one or more injectors to the substrate process area to form a silicon layer having a predetermined thickness on a surface of the substrate. In one or more embodiments, the predetermined thickness of the silicon layer is less than 2 nm or less than 1 nm.

Some embodiments provide that the apparatus further comprises a temperature controller that maintains the substrate temperature. In some embodiments, the substrate temperature is maintained below 400° C. or below 350° C.

The apparatus may also comprise a transfer valve to move a substrate from the substrate process area to a transfer chamber under controlled pressure to prevent exposure of the substrate having the silicon layer thereon to ambient air. The chamber body and the transfer valve may be part of a cluster tool, such as one also containing a high-k dielectric deposition chamber that deposits a high-k dielectric on the silicon layer and/or a cleaning chamber that atomic hydrogen cleans the substrate surface. 20. The high-k dielectric deposition chamber may deposit a high-k dielectric layer comprising hafnium oxide via an atomic layer deposition process.

The foregoing has outlined rather broadly certain features and technical advantages of the present invention. It should be appreciated by those skilled in the art that the specific embodiments disclosed may be readily utilized as a basis for modifying or designing other structures or processes within the scope present invention. It should also be realized by those skilled in the art that such equivalent constructions do not depart from the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
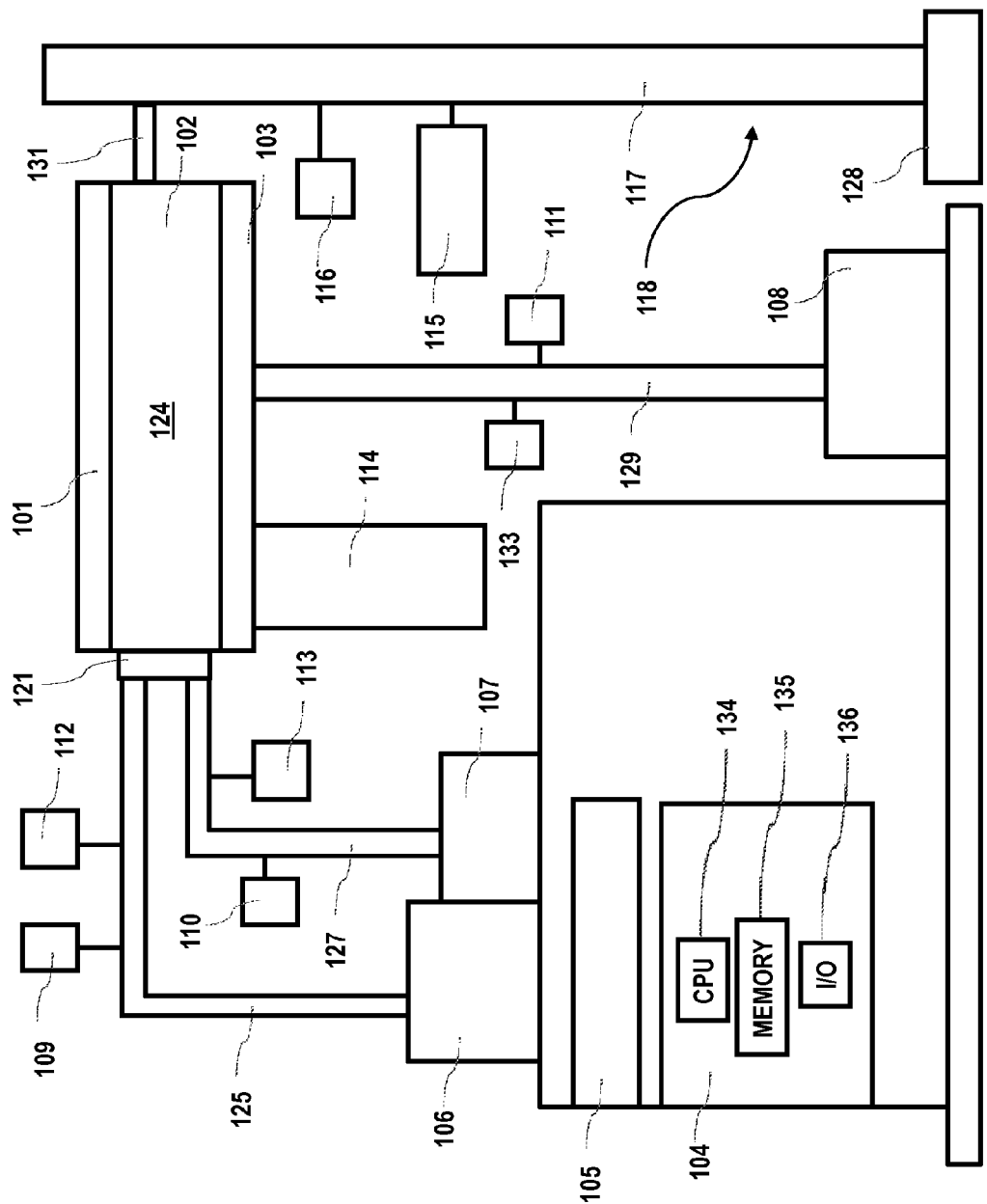
FIG. 1 illustrates a schematic of an apparatus in accordance with one or more embodiments of the invention.

In order to avoid the drawbacks of $AsO_x$ or $GeO_2$, new methods of forming high dielectric constant interfacial layers are provided, as well as apparatus for providing such layers. These interfacial passivation layers are believed to reduce trap density near the conduction band of germanium and III-V materials, resulting in high electron mobility in germanium and III-V n-MOSFETs.

One advantage of certain embodiments of the methods and apparatus described herein is manufacturability, because the methods may be implemented in apparatus that are based on production-worthy hardware and platforms.

As used herein, a "substrate surface," refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride, aluminum, copper, or any other conductor or conductive or non-conductive barrier layer useful for device fabrication. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

According to one or more embodiments, the substrate has a germanium or a III-V material surface.

One aspect of the present invention relates to a method of forming a silicon layer as an interfacial layer between a dielectric layer and a substrate having a germanium or III-V material on its surface. In embodiments of this aspect, the method comprises providing the substrate having a germanium or III-V semiconductor surface, depositing a silicon layer on the substrate surface via an atomic layer deposition process, and then depositing a dielectric layer on the silicon layer.

In some embodiments, the silicon is deposited at a temperature to avoid interdiffusion of silicon with the germanium or III-V semiconductor surface. Diffusion of germanium or III-V materials into the silicon layer, or diffusion of silicon into the germanium or III-V layer, is believed to reduce the beneficial properties of having the silicon interfacial layer between the germanium or III-V surface and the dielectric layer.

By using an atomic layer deposition process for depositing the silicon layer, the silicon may be deposited at a temperature to avoid interdiffusion. Other deposition processes, such as chemical vapor deposition (CVD), use substrate temperatures as high as 550° C. or 600° C. These high temperatures can allow interdiffusion. In contrast, ALD can be performed at lower temperatures. In some embodiments, the silicon ALD process is performed at a substrate temperature below 500° C. Other embodiments provide that the maximum temperature be below 450° C., 400° C., 350° C., or even 300° C.

An atomic layer deposition process also allows for precise control of the thickness of the silicon interfacial layer. Certain embodiments of the present invention provide that the silicon layer is less than 2 nm. Further embodiments provide that the silicon layer may be less than 1 nm, such as in the range from 0.5 nm to 1 nm.

Exemplary silicon precursors include, but are not limited to, silane ($SiH_4$), dichlorosilane ($SiCl_2H_2$), silicon tetrachloride ($SiCl_4$), disilane ($Si_2H_6$), and disilicon hexachloride ($Si_2Cl_6$). Co-reactants include, but are not limited to, atomic hydrogen.

In one or more embodiments, the method is performed under vacuum conditions, i.e. under reduced pressure and without exposing the substrate to ambient air. According to one or more embodiments, inert gases such as nitrogen may be present in the chamber.

In a typical ALD process, alternating pulses or flows of "A" precursor and "B" precursor can be used to deposit a film, for example, in a pulsed delivery of multiple cycles of pulsed precursors and co-reactants, for example, A precursor pulse, B precursor pulse, A precursor pulse, B precursor pulse, A precursor pulse, B precursor pulse, etc. The alternating exposure of the surface to reactants "A" and "B" is continued until the desired thickness film is reached. However, instead of pulsing the reactants, the gases can flow simultaneously from a gas delivery head or nozzle and the substrate and/or gas delivery head can be moved such that the substrate is sequentially exposed to the gases. Of course, the aforementioned ALD cycles are merely exemplary of a wide variety of ALD process cycles in which a deposited layer is formed by alternating layers of precursors and co-reactants In some embodiments, the silicon layer may be formed during a plasma enhanced atomic layer deposition (PEALD) process that provides sequential pulses of precursors and plasma. In specific embodiments, the co-reactant may involve a plasma. In other embodiments involving the use of plasma, during the plasma step the reagents are generally ionized during the process, though this might occur only upstream of the deposition chamber such that ions or other energetic or light emitting species are not in direct contact with the depositing film, this configuration often termed a remote plasma. Thus in this type of PEALD process, the plasma is generated external from the processing chamber, such as by a remote plasma generator system. During PEALD processes, a plasma may be generated from a microwave (MW) frequency generator or a radio frequency (RF) generator. Although plasmas may be used during the deposition processes disclosed herein, it should be noted that plasmas are not required.

Indeed, other embodiments relate to deposition processes under very mild conditions without a plasma.

According to one or more embodiments, the substrate is subjected to further processing prior to or after forming the silicon layer. This further processing can be performed in the same chamber as the silicon deposition chamber, or can be performed in one or more separate processing chambers. In one embodiment, the substrate having the silicon layer thereon is moved from the first chamber to a separate, second chamber for further processing. The substrate having the silicon layer thereon can be moved directly from the first chamber to the separate processing chamber, or it can be moved from the first chamber to one or more transfer chambers, and then moved to the desired separate processing chamber.

According to one or more embodiments, the substrate having the silicon layer thereon is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the silicon deposition chamber to prevent reactants from moving from the silicon deposition chamber to the transfer chamber and/or processing chamber. Thus, the flow of inert gas forms a curtain at the exit of the chamber.

Other processing chambers can include, but are not limited to, deposition chambers and cleaning chambers. According to one or more embodiments, a dielectric layer is deposited on the silicon layer by a deposition process, such as chemical vapor deposition (CVD) or atomic layer deposition (ALD). In a particular embodiment, the dielectric layer is deposited on the silicon layer via an atomic layer deposition process. In some embodiments, the dielectric layer is a high-k dielectric such as hafnium oxide ($HfO_2$), tantalum oxide ($Ta_2O_5$) or tantalum silicate (TaSiOx). Some embodiments provide that the substrate temperature is not raised above a maximum temperature while depositing the dielectric layer, in order to prevent interdiffusion between the silicon layer and the germanium or III-V material. The maximum temperature may be below 500° C., 450° C., 400° C., 350° C., or even 300° C.

According to one or more embodiments, the substrate having the germanium or III-V semiconductor surface is cleaned prior to depositing the silicon layer. In some embodiments, the cleaning process comprises atomic hydrogen cleaning. In order to prevent contamination of the cleaned substrate surface, the substrate may be under load lock conditions, i.e. the substrate is not exposed to air between atomic hydrogen cleaning and depositing the silicon layer. After depositing the silicon layer, the substrate may be kept under load lock conditions until the dielectric layer is deposited.

Another aspect of the invention relates to a method of processing a substrate, the method comprising providing a substrate having a germanium or III-V semiconductor surface, atomic hydrogen cleaning the substrate surface, depositing a silicon layer on the surface of the substrate via an atomic layer deposition process at a substrate temperature below 400° C., and depositing a dielectric layer on the silicon layer.

Embodiments of this aspect may have any of the features described for the first aspect. In some embodiments, the thickness of the silicon layer is less than 2 nm. Further embodiments provide that the silicon layer may be less than 1 nm, such as in the range from 0.5 nm to 1 nm.

Again, the substrate temperature may be controlled to prevent interdiffusion between the silicon layer and the germanium or III-V material. The maximum temperature may be less than 400° C., 350° C., or even 300° C.

Yet another aspect of the invention pertains to an apparatus for performing a process according to any of the embodiments described above. In particular, provided is an apparatus for forming a silicon layer on a substrate having a germanium or III-V semiconductor surface. In one or more embodiments, the apparatus comprises a chamber body, one or more injectors, and a control system. This apparatus will provide a supply of precursors to the substrate surface to deposit a silicon layer on the substrate. The apparatus may also comprise components such as a temperature controller or pressure controller.

FIG. 1 illustrates one embodiment in accordance with this aspect of the invention. Chamber body includes a chamber lid 101, chamber wall 102, and a chamber plate 103. Chamber lid 101, chamber wall 102 and chamber plate 103 define a substrate process area 124 where the deposition reaction occurs on a substrate surface. Lifting mechanism 114 raises and lowers the substrate so that the substrate can be moved in and out of the substrate process area with a robot blade or other suitable transfer mechanism. The apparatus may include a transfer valve (not shown) to move a substrate from the process area to a transfer chamber under controlled pressure to prevent exposure of the substrate to ambient air.

A first precursor is provided by precursor supply 106, which is delivered into the process area 124 via conduit 125, which can be any suitable conduit such as piping or channel to deliver the precursor at an appropriate flow rate to the process area 124 through injector 121. The first and second precursors may be dispersed from the same injector, or multiple injectors may be used to prevent mixing before reaching the substrate process area. Any appropriate flow configuration may be used for flowing the precursors into the substrate process area, including cross flow or top-down flow. The injectors 121 may comprise any means for dispersing the reactants into the substrate process area, including a showerhead or baffle plate The precursor supplies can be any suitable sources of the precursors, including a cylinder of the precursor gas or a generation system to generate the precursor gas. The flow of the first precursor gas to the chamber is regulated by precursor valve 109 and precursor flow controller 112, which can communicate with chamber controller 104. The flow controller 112 can be a mass flow or volume flow controller. A second precursor is provided by precursor supply 107 and delivered to the process area 124 via conduit 127 through the injector 121. The flow of the second precursor is regulated by precursor valve 110 and precursor controller 113, which can be a mass flow or volume flow controller. Valve 110 and flow controller 113 can be in communication with chamber controller 104. As shown in FIG. 1, the first and second precursors may be delivered to the chamber separately via separate conduits 125 and 127. However, it is within the scope of the invention to mix the precursors prior to introducing the gases into the chamber, and deliver them in a single conduit.

An inert gas supply 108 can be used to provide an inert gas as a purge gas via inert gas conduit 129 to remove reactants and/or byproducts from the chamber body via the exhaust system 118. In addition, the inert gas can be used as a carrier gas to deliver reactants into the chamber by mixing the inert gas with one or both the first precursor supply or the second precursor supply. If the inert gas is to be used as a carrier gas, the inert gas conduit would include appropriate interconnects (not shown) to connect inert gas conduit 129 with one or both of precursor gas conduit 125 and/or precursor conduit 127. Appropriate interconnects would include valves and/or flow controllers (not shown) that would be in communication with chamber controller 104. Inert gas valve 111 regulates the flow of inert gas to the chamber body. A flow controller 133 may also be used to regulate the flow of inert gas into the chamber.

A temperature controller 105 may control the various heating and cooling elements of the apparatus, such as heating and/or cooling elements for the chamber plate 103. The temperature controller may maintain the temperature during the atomic layer deposition below a maximum temperature, such as below 400° C. or below 350° C.

In one or more embodiments, the apparatus may comprise an exhaust system 118 for removing gases from the chamber body. A pump 128 in flow communication with exhaust line 117 connected to the chamber via exhaust conduit 131 removes excess reactants and byproducts of the silicon layer formation process from the process area 124 when the layer has been deposited. An isolation valve 116 can be used to isolate the chamber body from the pump 128. A throttle valve 115 can be used to regulate the pressure in the chamber body to achieve the desired pressure in the process area 124.

In one or more embodiments, various elements of the apparatus such as the precursor flow controller 112, the precursor flow controller 113, and the temperature controller 105 are controlled by the chamber controller 104, which provides I/O control of the apparatus. In specific embodiments, the chamber controller 104 communicates with the various other control elements to control the thickness of the silicon layer. The chamber controller 104 may control the quantity of precursors delivered to the process chamber area, such that the silicon layer formed has a predetermined thickness. The chamber controller 104 may also control other factors that influence the thickness of the silicon layer, such as the temperature and/or pressure in the process area.

In some embodiments, this predetermined thickness is related to a desired property of the gate stack. According to one or more embodiments, the predetermined thickness of the silicon layer is less than 2 nm. In some embodiments, the predetermined thickness of the silicon layer is less than 1 nm.

The chamber controller 104 can include a CPU 134, a memory 135 and an I/O 136 in wired or wireless communication with the various controllers. The CPU 134 sends and receives signals to the precursor flow controller 112 and the precursor flow controller 113 to control the flow of the first and second precursors to the injector 121. The CPU 134 also sends and receives signals to the throttle valve 115 to control pressure in the substrate process area so that the throttle valve 115 operates as a pressure control valve for the apparatus. The CPU 134 can also be in communication with the isolation valve 116 and pump 128 to further control the flow of exhaust from the chamber.

The CPU may be one of any forms of a computer processor that can be used in an industrial setting for controlling various chambers and sub-processors. Thus, the CPU can be coupled to the memory 135 which may be one or more of readily available memory such as random access memory (RAM), read only memory (ROM), flash memory, compact disc, floppy disk, hard disk, or any other form of local or remote digital storage. Support circuits (not shown) can be coupled to the CPU to support the CPU in a conventional manner. These circuits include cache, power supplies, clock circuits, input/output circuitry, subsystems, and the like. The CPU 134 and the memory 135 are coupled to an appropriate I/O circuit 136 to communicate with the various controllers of the apparatus.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate must be moved relative to the gas distribution plate, or vice-versa.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and exposed to the deposition gases at different positions.

The control system may further a computer-readable medium having a set of machine-executable instructions. These instructions may be such that, when executed by the CPU, cause the apparatus to perform any of the methods previously described. In one embodiment, the instructions relate to a method comprising exposing a surface of the substrate to one or more silicon precursors to form a silicon layer having a predetermined thickness on the substrate surface. The instructions may also relate to exposing the substrate surface to co-reactants such as atomic hydrogen.

In another embodiment, the instructions relate to a method comprising: exposing a surface of the substrate to one or more silicon precursors to provide a silicon layer having a predetermined thickness on the surface of the substrate; moving the substrate having the silicon layer thereon from the process area to a transfer chamber; moving the substrate from the transfer chamber to a deposition chamber; and depositing a dielectric layer on the silicon layer.

The apparatus may further comprise other chambers in addition to the silicon deposition chamber. These chambers can include transfer chambers and additional processing chambers, such as deposition chambers and cleaning chambers. These chambers may be interconnected in a "cluster tool system."

Generally, a cluster tool is a modular system comprising multiple chambers which perform various functions including substrate center-finding and orientation, degassing, annealing, deposition and/or etching. According to an embodiment of the present invention, a cluster tool includes at least a first chamber configured to deposit the silicon layer. The multiple chambers of the cluster tool are mounted to a central transfer chamber which houses a robot adapted to shuttle substrates between the chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein.

Figure 2:
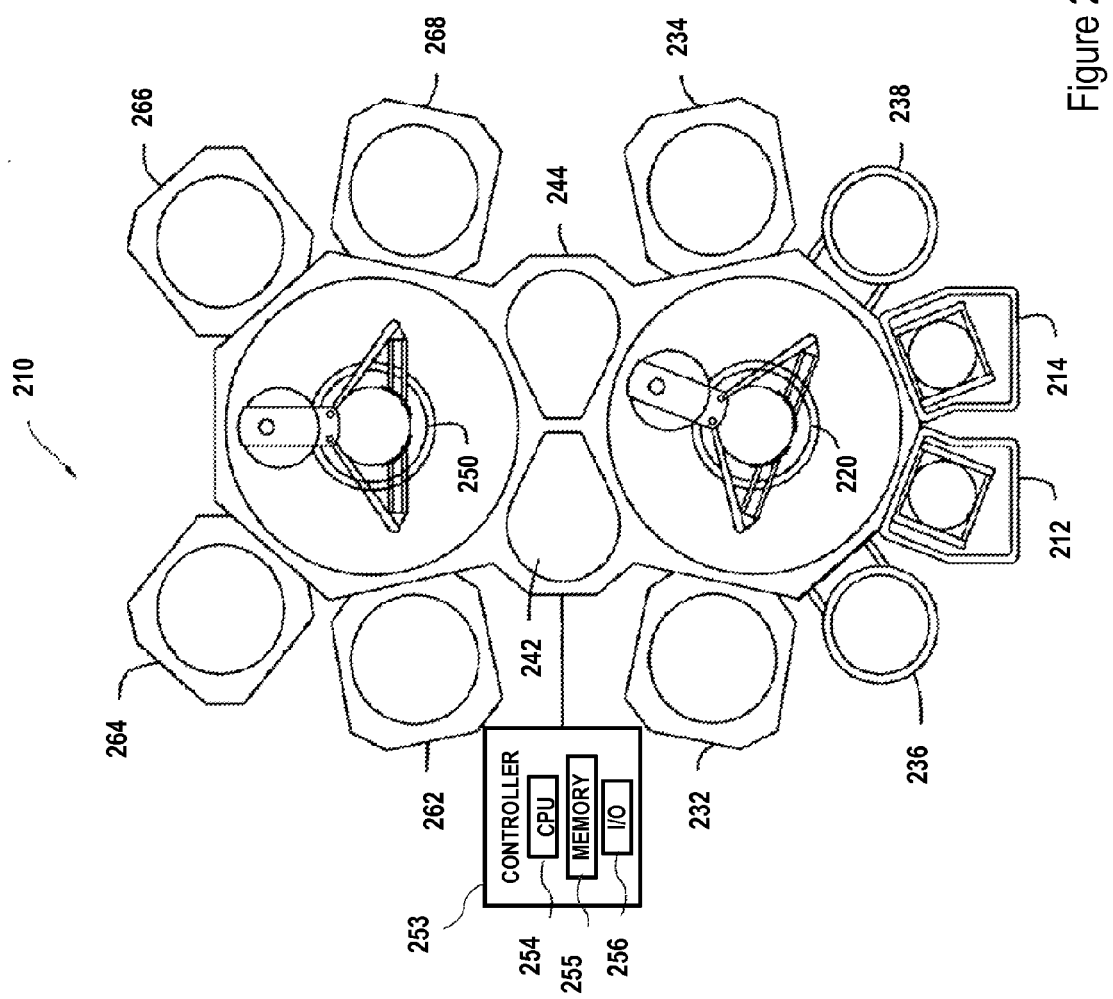
FIG. 2 illustrates a schematic of a cluster tool system in accordance with one or more embodiments of invention.

FIG. 2 shows an example of a cluster tool or multi-chamber processing system 210 that can be used in conjunction with an aspect of the invention. The processing system 210 can include one or more load lock chambers 212, 214 for transferring substrates into and out of the system 210. Typically, since the system 210 is under vacuum, the load lock chambers 212, 214 may "pump down" substrates introduced into the system 210. A first robot 220 may transfer the substrates between the load lock chambers 212, 214, and a first set of one or more substrate processing chambers 232, 234, 236, 238. Each processing chamber 232, 234, 236, 238, may be configured to perform a number of substrate processing operations. For example, processing chamber 232 can be an etch processor designed to practice an etch process, and processing chamber 234 can be a deposition reaction chamber for performing ALD or CVD, or a rapid thermal processing (RTP) or RadOx® chamber designed to form a thermal oxide layer on a substrate. Processing chambers 236, 238 may also be configured to further provide, for example, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes.

The first robot 220 can also transfer substrates to/from one or more transfer chambers 242, 244. The transfer chambers 242, 244 can be used to maintain vacuum conditions while allowing substrates to be transferred within the system 210. A second robot 250 can transfer the substrates between the transfer chambers 242, 244 and a second set of one or more processing chambers 262, 264, 266, 268. Similar to processing chambers 232, 234, 236, 238, the processing chambers 262, 264, 266, 268 can be configured to perform a variety of substrate processing operations, including etch processes, in addition to cyclical layer deposition (CLD), atomic layer deposition (ALD), chemical vapor deposition (CVD), physical vapor deposition (PVD), epitaxial deposition, etch, pre-clean, chemical clean, thermal treatment such as RTP/RadOx®, plasma nitridation, degas, and orientation. Any of the substrate processing chambers 232, 234, 236, 238, 262, 264, 266, 268 may be removed from the system 210 if not needed.

By carrying out this process in a chamber on a cluster tool, surface contamination of the substrate with atmospheric impurities is avoided and a thin film of silicon can be provided without oxidation prior to depositing a subsequent dielectric film.

Applied Materials, Inc. of Santa Clara, Calif. offers a substrate processing chamber which includes a process called RadOx® to form thin silicon dioxide layers for CMOS transistor gates. The RadOx® process heats the substrate with lamps and injects hydrogen and oxygen into a process chamber. These gases form radicals when they strike the surface of the substrate. The radicals are more reactive than neutral species, providing a faster layer growth rate than would be available with steam processes known as In Situ Steam Generated (ISSG) oxide growth.

Suitable etch or clean chambers can be configured for wet or dry etch, reactive ion etch (RIE), or the like. Exemplary etch chambers include the SICONI™ Producer®, or Carina™ chambers, also available from Applied Materials, Inc. of Santa Clara, Calif. One non-limiting, exemplary dry etch process may include ammonia ($NH_3$) or nitrogen trifluoride ($NF_3$) gas, or an anhydrous hydrogen fluoride (HF) gas mixture with a remote plasma, which condenses on $SiO_2$ at low temperatures (e.g., about 30° C.) and reacts to form a compound which can be sublimated at moderate temperature (e.g., >100° C.) to etch $SiO_2$. Such an exemplary etch process can diminish over time and eventually saturate to a point where no further etching occurs unless portions of the compound are removed (for example, by the sublimation process described above). The etch process can be controlled using the above mechanism and/or by a timed etch process (e.g., etching for a predetermined period of time). Exemplary wet etch processes may include hydrogen fluoride (HF) or the like. Exemplary plasma or remote plasma etch processes may include one or more etchants such as carbon tetrafluoride ($CF_4$), trifluoromethane ($CHF_3$), sulfur hexafluoride ($SF_6$), hydrogen ($H_2$), or the like, and may be performed with or without a heating chuck.

In specific embodiments, a process is performed including a first step in which the robot 220 moves a substrate from one of the load lock chambers 212, 214 to a deposition chamber to form a silicon layer. Alternatively, the substrate surface may be cleaned prior to depositing the silicon layer, such as by atomic hydrogen cleaning. After the silicon layer is deposited, the substrate can be moved in a second step back into a load lock chamber 212, 214 or directly transferred to a deposition chamber to form a dielectric layer. After depositing a dielectric layer, the substrate can then be moved to other chambers for subsequent processing or can be moved to a load lock chamber 212, 214.

Controller 253 may be one of any form of general-purpose data processing system that can be used in an industrial setting for controlling the various subprocessors and subcontrollers. Generally, controller 253 includes a central processing unit (CPU) 254 in communication with memory 255 and input/output (I/O) circuitry 256, among other common components.

In one exemplary process, a substrate having a germanium or III-V material surface is cleaned by atomic hydrogen cleaning, then transferred under load lock conditions to a silicon deposition chamber. A silicon layer is formed on the cleaned substrate surface by an atomic layer deposition process. The substrate is then transferred under load lock conditions to another deposition chamber, wherein a high-k dielectric is formed on the silicon layer, such as by an atomic layer deposition process. By integrating these three in-situ processes in a cluster tool configuration, the silicon passivation layer can be formed without any exposure to ambient air. After deposition of the high-k layer, the vacuum may be broken without oxidizing the underlying silicon layer.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method of processing a substrate comprising:
providing a substrate having a germanium or III-V semiconductor surface;
depositing a silicon layer on the surface of the substrate via an atomic layer deposition process comprising sequential exposure to a silicon precursor comprising one or more of silane, dichlorosilane, silicon tetrachloride, disilane or disilicon hexachloride and a co-reactant comprising atomic hydrogen at a maximum temperature below 300° C. to avoid interdiffusion of silicon with the germanium or III-V semiconductor surface; and
depositing a dielectric layer on the silicon layer.

2. The method of claim 1, wherein the silicon layer has a thickness less than 1 nm.

3. The method of claim 1, wherein depositing the dielectric layer comprises forming a high-k dielectric layer via an atomic layer deposition process.

4. The method of claim 3, wherein the high-k dielectric comprises one or more of hafnium oxide, tantalum oxide and tantalum silicate.

5. The method of claim 1, further comprising atomic hydrogen cleaning the substrate surface prior to depositing the silicon layer.

6. The method of claim 5, wherein the substrate is not exposed to air between atomic hydrogen cleaning and depositing the silicon layer and the substrate is not exposed to air between depositing the silicon layer and depositing the dielectric layer.

7. A method of processing a substrate comprising:
providing a substrate having a germanium or III-V semiconductor surface;
atomic hydrogen cleaning the substrate to provide a cleaned substrate surface;
depositing a silicon layer on the surface of the substrate via an atomic layer deposition process comprising sequential exposure to a silicon precursor comprising one or more of silane, dichlorosilane, silicon tetrachloride, disilane or disilicon hexachloride and a co-reactant comprising atomic hydrogen at a maximum temperature below 300° C. to avoid interdiffusion of silicon with the germanium or III-V semiconductor surface; and
depositing a dielectric layer on the silicon layer.

8. The method of claim 7, wherein the wherein the silicon layer has a thickness less than 1 nm.

9. The method of claim 7, wherein the substrate is not exposed to air between atomic hydrogen cleaning and depositing the silicon layer and the substrate is not exposed to air between depositing the silicon layer and depositing the dielectric layer.

* * * * *